(12) United States Patent
Wagner et al.

(10) Patent No.: US 6,763,881 B1
(45) Date of Patent: Jul. 20, 2004

(54) THERMALLY MATCHED GRADIENT HEAT SINK

(75) Inventors: Guy R Wagner, Loveland, CO (US); Chandrakant Patel, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 130 days.

(21) Appl. No.: 09/507,507

(22) Filed: Feb. 18, 2000

(51) Int. Cl.[7] .............................................. F24H 3/02
(52) U.S. Cl. ...................... 165/121; 165/803; 165/185; 165/905; 361/697; 361/705; 361/709; 361/708
(58) Field of Search ................................ 165/80.3, 121, 165/185, 905; 361/704, 705, 706, 708, 709, 710, 697

(56) References Cited

U.S. PATENT DOCUMENTS

| | | | | |
|---|---|---|---|---|
| 4,700,273 A | * | 10/1987 | Kaufman ..................... 361/708 |
| 5,050,040 A | * | 9/1991 | Gondusky et al. .......... 361/708 |
| 5,587,882 A | * | 12/1996 | Patel ........................... 361/705 |
| 5,602,720 A | * | 2/1997 | Natsuhara et al. .......... 361/708 |
| 5,623,394 A | * | 4/1997 | Sherif et al. ................. 361/705 |
| 5,675,474 A | * | 10/1997 | Nagase et al. .......... 361/708 X |
| 5,744,863 A | * | 4/1998 | Culnane et al. .......... 361/705 X |
| 5,785,116 A | | 7/1998 | Wagner ..................... 165/80.3 |
| 5,847,929 A | * | 12/1998 | Bernier et al. .......... 361/706 X |
| 5,931,222 A | * | 8/1999 | Toy et al. ................... 165/185 |
| 6,046,907 A | * | 4/2000 | Yamaguchi ............. 361/708 X |
| 6,091,603 A | * | 7/2000 | Daves et al. ............ 361/708 X |

\* cited by examiner

*Primary Examiner*—David A. Scherbel

(57) ABSTRACT

An assembly comprising a heat generating electronic device and a heat sink is provided with an intermediate gradient region between them. This intermediate region comprises a material having a coefficient of thermal expansion substantially matching the coefficient of thermal expansion of the heat generating electronic device, and a thermal conductivity greater than the thermal conductivity of the electronic device but less than the thermal conductivity of the heat sink. Provision of this intermediate layer substantially reduces stress on the electronic device caused by thermal cycling.

20 Claims, 2 Drawing Sheets

THERMALLY MATCHED GRADIENT HEAT SINK

FIELD OF THE INVENTION

This invention relates to a thermally matched interface between a heat producing electronic device and a heat sink. More particularly, this invention relates to a thermally matched gradient interface made of materials having selected coefficients of thermal expansion and thermal conductivity, the interface being interposed between a heat producing integrated circuit and a primary heat sink on a printed circuit board.

BACKGROUND OF THE INVENTION

Current, high efficiency integrated circuit devices, particularly high-speed central processing units for computers, generate substantial amounts of heat energy during operation. If this heat is not continuously removed, a device may be damaged or its operating performance significantly diminished.

A preferred method of removing excess heat from central processing units is to provide a heat sink device. In critical applications, a preferred means of heat removal is the use of a fan-assisted heat sink device. The heat sink itself is formed of a material with high thermal conductivity, such as aluminum, which readily conducts heat away from the integrated circuits and may be provided with fins to increase surface area and direct air flow. The heat sink is placed over and in contact with the integrated circuit device. Generally the heat sink is held in place mechanically by a bracket or frame. Where a bracket or frame is used, thermal grease may be interposed between the integrated circuit and the heat sink device. Alternatively, the heat sink may be bonded to the integrated circuit with solder or adhesive.

In the fan-assisted heat sinks, the fan draws cooling air into contact with the heat sink body to efficiently draw heat away from the electronic device. One such fan assisted heat sink device is described in U.S. Pat. No. 5,785,116 assigned to the assignee hereof, and incorporated herein by reference.

A problem encountered with the use of such efficient heat sinks is the wear and tear on the underlying electronics due to thermal cycling. That is, stress is created at the heat sink-integrated circuit junction when the integrated circuit heats up and cools down during use. If the integrated circuit is physically bonded to the heat sink, the integrated circuit itself, the electrical connections, and the underlying printed circuit board repeatedly expand and contract at different rates due to the differing coefficients of thermal expansion of the components. If thermal grease is used between the integrated circuit device and the heat sink, the grease may be "pumped out" by repeated thermal cycling. If the heat sink is simply positioned adjacent the integrated circuit, there is less than optimum contact between the integrated circuit and the heat sink, reducing the conduction of heat away from the integrated circuit.

Materials with coefficients of thermal expansion similar to those of integrated circuits may be used to form heat sinks. However, these materials generally have lower thermal conductivity than those metals which are good heat conductors. Heat sinks made from such low heat conductivity materials are consequently inefficient at heat dissipation, potentially resulting in damage to the electronics, or the requirement for heat sinks that are too big and bulky to be practical.

Accordingly, a means and method have been sought to practically and efficiently remove heat from electronic devices by means of heat sinks without inducing harmful stresses.

BRIEF SUMMARY OF THE INVENTION

In accordance with the invention, an assembly comprising a heat generating electronic device and a heat sink body is provided with an intermediate, heat-matching, gradient region between them. By intermediate gradient region herein is meant the region between the underlying heat generating device and the heat sink body, which has a thermal conductivity as great or greater than the underlying electronics but lower than or equal to the thermal conductivity of the heat sink. This intermediate gradient region is made up of one or more materials having a coefficient of thermal expansion substantially matching the coefficient of thermal expansion of the heat generating electronic device, and a thermal conductivity greater than the thermal conductivity of the heat-generating device but less than the thermal conductivity of the heat sink. Provision of this intermediate region substantially reduces stress on the electronic device caused by thermal cycling.

In another embodiment, a specially adapted intermediate gradient region is interposed between a heat generating component and a heat sink. The intermediate region has a first base portion with a coefficient of thermal expansion substantially matching the coefficient of thermal expansion of an underlying, heat generating component (such as a central processing unit for a computer), but a higher thermal conductivity. The intermediate gradient region further has a second portion, integral with the first base portion, that serves as the principal heat dissipating element of the "hybrid" intermediate gradient region. This second portion has a higher thermal conductivity than either the base or underlying electronic component. Accordingly, thermal cycling stresses are absorbed by the overlying intermediate region and heat sink body, rather than the underlying electronics or circuit board, preventing damage to the electronics.

The invention will be better understood in terms of the figures and detailed description which follow.

DETAILED DESCRIPTION OF THE INVENTION

Figure 1:
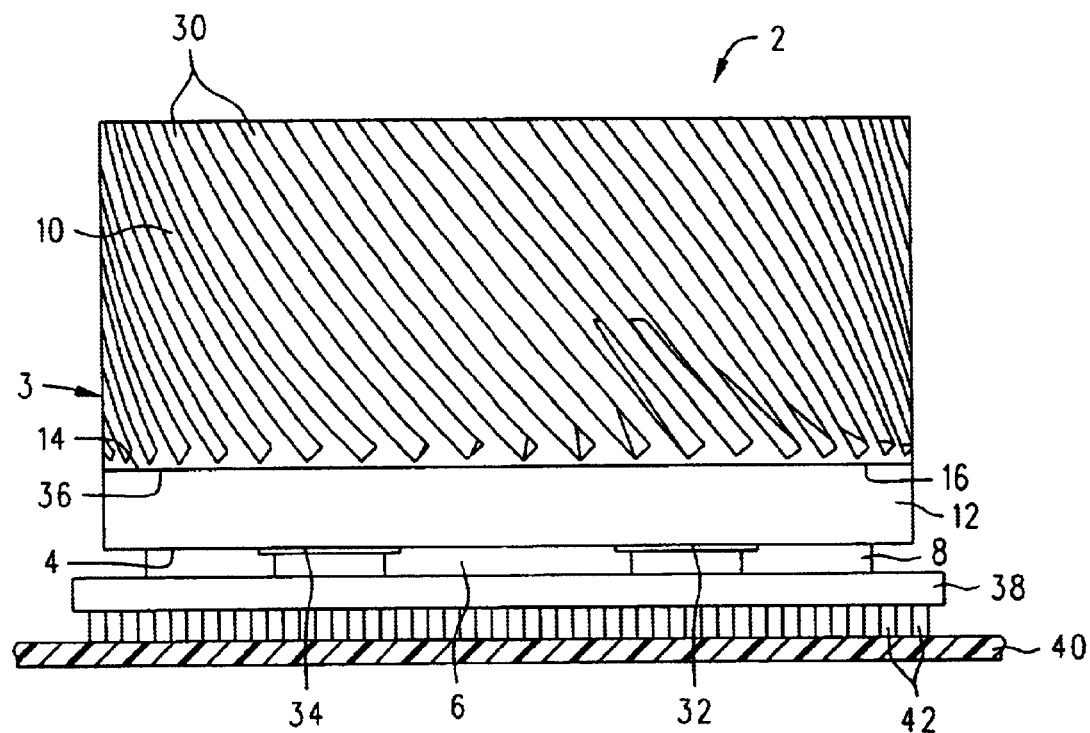
FIG. 1A is a side view similar to FIG. 1 of an alternative embodiment having additional layers between the intermediate layer and a heat sink body.

In accordance with an embodiment of the invention and with reference to FIG. 1, an assembly 2 has heat generating electronic devices 4, 6, and 8. Devices 4, 6 and 8 are depicted in FIG. 1 as computer central processing unit chips, each having a substantially similar first coefficient of thermal expansion and a substantially similar first thermal conductivity. Assembly 2 further has primary heat sink device 3 that features heat sink body 10 and intermediate region 12. Heat sink 10 is formed of a material with good thermal conductivity and is specifically sized and shaped to carry heat away from devices 4, 6 and 8 during their operation. Heat sink 10 has a coefficient of thermal expansion greater than the coefficient of thermal expansion of the devices 4, 6 and 8, and a thermal conductivity greater than the thermal conductivity of devices 4, 6 and 8.

Intermediate region 12 between devices 4, 6 and 8 and heat sink 10 is made of a material having a coefficient of thermal expansion substantially matching the coefficient of thermal expansion of devices 4, 6 and 8. The thermal conductivity of region 12 is greater than the thermal conductivity of devices 4, 6 and 8 but less than or equal to the thermal conductivity of heat sink 10.

As shown in FIG. 1, heat sink 10 and intermediate region 12 are separately formed bodies. In other words, the intermediate region 12 is discrete from the heat sink body 10. Top 14 of region 12 is adjacent to and illustrated to be coextensive with bottom 16 of heat sink 10. Top 14 and bottom 16 may be bonded to heat sink 10 and chips 4, 6, and 8, respectively, by a chemical adhesive layer 36 that has suitable physical properties of thermal conductivity and thermal expansion such as filled epoxy. Layer 36 may alternatively be a suitable solder or thermal grease. In another embodiment, regions 10 and 12 may be sintered together to form a permanent attachment.

Again referring to FIG. 1, heat sink device 3 has heat generating electronic devices 4, 6 and 8. These devices have a first coefficient of thermal expansion and a first thermal conductivity. Heat sink device 3 for conducting heat away from heat generating devices 4, 6 and 8 has a first intermediate region 12 and a second heat sink body region 10.

Intermediate region 12 of heat sink device 3 is adjacent to heat generating devices 4, 6 and 8. Region 12 has a second coefficient of thermal expansion substantially matching the first coefficient of thermal expansion of devices 4, 6 and 8. Intermediate region 12 has a thermal conductivity greater than the first thermal conductivity of devices 4, 6 and 8.

Heat sink region 10 of heat sink device 3 has a third coefficient of thermal expansion greater than the second coefficient of thermal expansion of region 12 and region 10 has a third thermal conductivity greater than or equal to the thermal conductivity of region 12.

Figure 2:
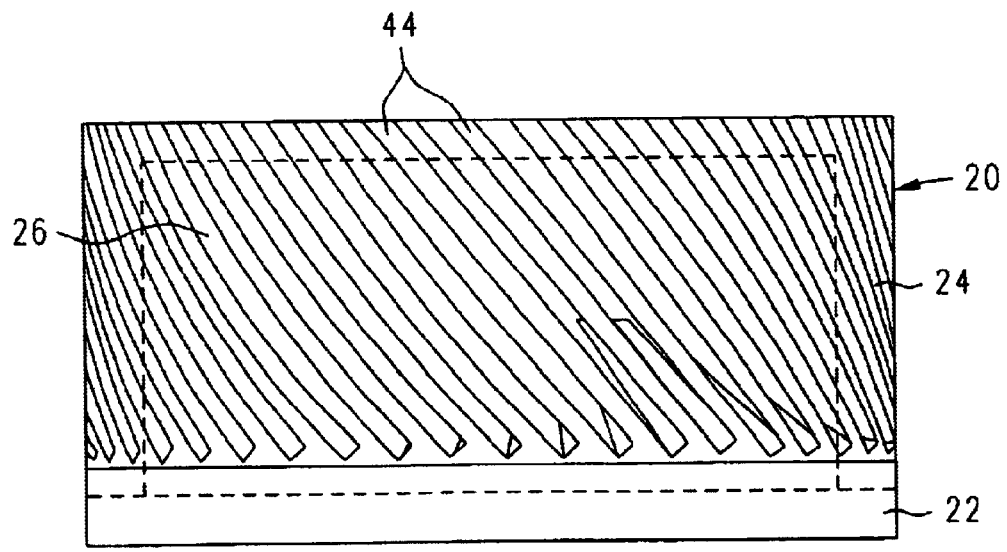
FIG. 2 is a side view of a thermally matched heat sink body, the composition of which changes to a more heat conductive material towards the outer distal fin areas.

In another embodiment, and with reference to FIG. 2, the heat sink device body 20 of a finned turbocooler which is used to cool a heat generating electronic device has a first base region 22 which is positioned adjacent the heat generating device during use. First region 22 is made of a material that has a coefficient of thermal expansion substantially matching that of the device it cools. First region 22 also has a thermal conductivity greater than that of the electronic device it cools.

A second region 24, remote from but in thermal contact with first region 22, is made of a material having a coefficient of thermal expansion and a thermal conductivity greater than those of region 22. In one embodiment, the material composition of heat sink body varies from region 22 to region 24 along a fairly uniform compositional gradient. For example, region 22 may be AlSiC while region 24 is aluminum metal and remaining region 26 varies in composition from AlSiC to aluminum metal. Such a coherent body of varying composition could be formed by sintering, swaging, casting or other such process known in the art. Moreover, a body 20 may be formed with fins 44 in place or they may be machined from a billet.

In accordance with the invention, a method of reducing the stress induced by heat cycling in an electronic device, such as the central processing units 4, 6 and 8 of FIG. 1, is to provide a heat sink device 3 adjacent electronic devices 4, 6 and 8. Heat sink device 3 has a coefficient of thermal expansion in region 12 adjacent the electronic device that substantially matches the electronic device's coefficient of thermal expansion but a greater thermal conductivity than the electronic device. Region 10, adjacent region 12, has a coefficient of thermal expansion greater than region 12, and a thermal conductivity greater than or equal to that of region 12. Heat sink device 3 is united to the underlying electronic device such that a continuous heat path is formed among electronic devices 4, 6 and 8, adjacent region 12, and region 10.

Referring in greater detail to FIG. 1, heat sink assembly 2 comprises heat sink device 3 which is used to cool underlying central processing unit chips 4, 6 and 8. Assembly 2 has intermediate region 12 and heat sink body 10. As shown in FIG. 1, intermediate layer 12 is thinner than fan-cooled body 10. While some heat is dissipated by heat-matched intermediate layer 12, body 10 serves the primary heat sink function. Heat sink body 10 has a hollow cylindrical shape with angled fins 30 arrayed around the outside. A cooling fan (not shown) resides in the center of body 10, and is activated to rapidly move air around the high surface area of fins 30 to dissipate heat. Heat sink body 10 may, for example, be configured as described in U.S. Pat. No. 5,785,116 previously referenced. Alternately, heat sink body 10 may be any other type of heat sink body or device such as a block of heat conductive material, a heat pipe, a piezoelectric cooler or other heat sink known to those skilled in the art. The shape and size of a particular heat sink are based on the application in which it is used, the design of such being well-known in the art.

Figure 1A:
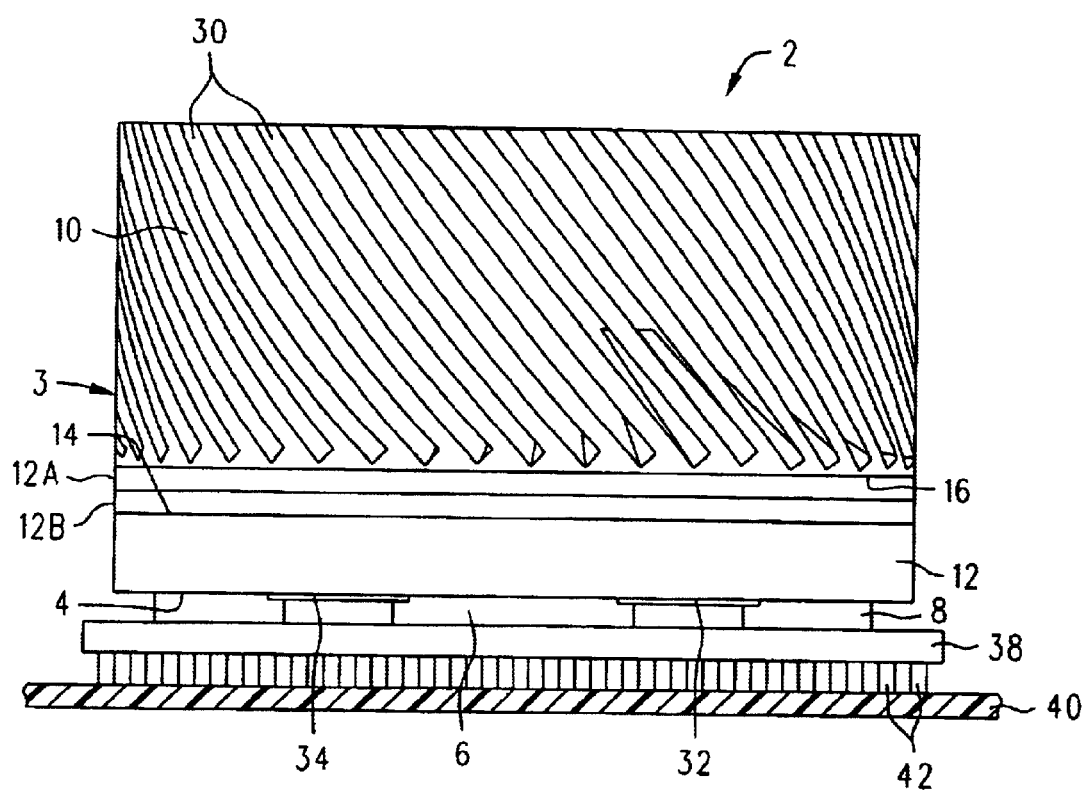

While the invention has been depicted with one matched coefficient of thermal expansion intermediate layer 12, additional layers may be interposed between a layer 12 and a heat sink body 10, each layer having a higher thermal conductivity than the one underneath it. FIG. 1A illustrates an exemplary version of such an alternative embodiment in which additional layers 12A and 12B are interposed between the layer 12 and the heat sink body 10.

Primary heat sink body 10 may be formed of any suitable heat dissipating material subject to the limitations set out in the claims. A preferred material for body 10 is aluminum and aluminum alloys, however, other materials such as copper, silver, nickel, iron and their alloys, for example, may be selected by one skilled in the art.

Intermediate or gradient interface region 12 underlies heat sink body 10 and is thermally coupled to it so that heat is withdrawn from region 12 into primary heat sink body 10. In FIG. 1, body 10 is bonded to intermediate region 12 by adhesive layer 36. Bottom 32 of interface region 12 overlays heat generating chips 4, 6 and 8 and is bonded to them by adhesive layer 34. Chips 4, 6 and 8 are located as desired on substrate 38 and which is attached to epoxy composite printed circuit board 40 by conductive pins 42. Inclusion of heat-matched intermediate layer 12 in accordance with the invention substantially reduces stress on underling chips 4, 6, and 8 due to thermal cycling so the adhesive bonds are less prone to failure.

FIG. 2 shows an alternate embodiment of a thermally matched gradient heat sink having cooling fins 44, similar in outward appearance to the combination of details 10 and 12 of FIG. 1. Heat sink device body 20 is comprised of materials that vary in composition from base region 22 that is thermally matched to an underlying, heat-producing device, to the top and distal fin region 24 that has a relatively higher thermal conductivity. The material composition of device body 20 may vary gradually and uniformly from region 22 to 24, or the base region 22 may be formed of one material and the balance of body 20 of another material.

For example, region 22 could be AlSiC alloy and the balance of the body aluminum metal. In the alternative, region 22 could be AlSiC and the composition of the rest of the body would gradually comprise more and more aluminum until region 24 is substantially aluminum metal.

The material used to form the portion of a heat sink assembly which lies adjacent the heat producing element or elements and the primary heat sink body are chosen to have a coefficient of thermal expansion which substantially matches that of the underlying chips 4, 6 or 8. Table 1 shows the coefficient of thermal expansion and thermal conductivity for two common semiconductor materials.

| Semiconductor Material | Coefficient of Thermal Expansion ($10^{-6} \cdot K^{-1}$) | Thermal Conductivity ($W \cdot m^{-1} \cdot K^{-1}$) |
|---|---|---|
| Si | 3.2 | 140 |
| Gallium Arsenide | 5.5 | 46 |

Table 2 shows the coefficients of thermal expansion for printed circuit boards and common bonding materials for electronics manufacture.

| Printed Circuit Board and Bonding Materials | Coefficient of Thermal Expansion ($10^{-6} \cdot K^{-1}$) | Thermal Conductivity ($W \cdot m^{-1} \cdot K^{-1}$) |
|---|---|---|
| Epoxy/Glass | 13.5 | 0.2 |
| Epoxy/Kevlar | 6.7 | 0.2 |
| Alumina Chip Carriers | 6.0 | 20 |
| Glasses | 0.6–4.0 | 0.1 |
| Glass-Ceramics | 4.2 | 3 |

Once the coefficient of thermal expansion of the electronic package or component is determined, then the material selection of the portion of the heat sink that will lie adjacent to it may be selected. When a single heat sink assembly is used to cool underlying components having different coefficients of thermal expansion, an average coefficient of thermal expansion value may be calculated.

The intermediate region that interfaces with the heat sink body preferably has a coefficient of thermal expansion substantially matching the coefficient of thermal expansion of the component to be cooled. In a preferred embodiment, the coefficient of thermal expansion of the interface is generally in a range of from about 1.5 $10^{-6}.K^{-1}$ to about 4.0 $10^{-6}.K^{-1}$ more than the coefficient of thermal expansion of the component to be cooled. For most semiconductor central processing units, the coefficient of thermal expansion of the interface would be in the range of from about 4.5 to 10.0 $10^{-6}.K^{-1}$.

It is also notable that the thermal conductivity of the component interface region be equal to or greater than the thermal conductivity of the component to be cooled to promote conduction of heat into the intermediate region and away from the component.

The main heat dissipation regions (depicted as detail 10 in FIG. 1, and details 24 and 26 in FIG. 2, for example) have higher coefficients of thermal expansion and thermal conductivities than the interface region 12. Accordingly, stresses caused by thermal cycling are experienced principally at the junction between the top of the intermediate region and the primary heat sink body, thereby reducing stress on the underlying component.

Table 3 shows the coefficients of thermal expansion and thermal conductivities for a number of potential materials for the interface region of a heat sink and the main heat dissipation body. One skilled in the art can use such a table to select materials having suitable coefficients of thermal expansion and thermal conductivities to select appropriate materials to practice the invention. For example a layer of BeO could be used as an interface layer between a gallium arsenide semiconductor chip and an aluminum heat sink body.

| Interface & Heat Sink Materials | Coefficient of Thermal Expansion ($10^{-6} \cdot K^{-1}$) | Thermal Conductivity ($W \cdot m^{-1} \cdot K^{-1}$) |
|---|---|---|
| $Si_3N_4$ | 3.1 | 25 |
| W | 4.5 | 178 |
| Mo | 5.0 | 140 |
| Ta | 6.5 | 54 |
| BeO | 6.5 | 200 |
| AlSiC | 6.5–9.0 | 180 |
| Cu | 17.0 | 393 |
| Al | 23.0 | 209 |
| Pb 5% Sn | 29.0 | 63 |
| Ag | 19.7 | 418 |

While our invention has been described in terms of specific embodiments thereof, other forms may be readily adapted by one skilled in the art. For example, a number of suitable materials for the subject gradient heat sinks have been suggested, but one skilled in the art would be able to make substitutions without straying from the invention. In that all embodiments cannot be described within the specification, the scope of the invention is to be limited only in accordance with the following claims.

What is claimed is:

1. A heat sink for a heat generating device, the device having a first coefficient of thermal expansion and a first thermal conductivity, the heat sink comprising:
    a body for removing heat from the heat generating device, the body having a second coefficient of thermal expansion greater than the first coefficient of thermal expansion and a second thermal conductivity greater than the first thermal conductivity; and
    an intermediate region between the heat generating device and the body, the intermediate region comprising a material having a coefficient of thermal expansion substantially matching the first coefficient of thermal expansion and the intermediate region having a thermal conductivity greater than the first thermal conductivity and less than or equal to the second thermal conductivity;
    wherein said intermediate region is discrete from the body; and
    wherein said heat sink further comprises one or more discrete layers between the top of said intermediate region and the bottom of the body.

2. The heat sink of claim 1 wherein the coefficient of thermal expansion of said intermediate region is in the range of from about $1.5 \times 10^{-6}.K^{-1}$ less than to about $4.0 \times 10^{-6}.K^{-1}$ greater than said first coefficient of thermal expansion of said heat generating device.

3. The heat sink of claim 1 wherein the intermediate region comprises a material having a coefficient of thermal expansion from about 4.5 to about $10.0 \times 10^{-6}.K^{-1}$.

4. The heat sink of claim 1 wherein the intermediate region comprises AlSiC and the body comprises aluminum.

5. The heat sink of claim 1, wherein the body further comprises a cooling fan.

6. The heat sink of claim 1, wherein said one or more discrete layers comprises a plurality of discrete layers.

7. The heat sink of claim 6 wherein each of said plurality of discrete layers has a coefficient of thermal expansion greater than the layer beneath it.

8. A heat sink for a heat generating electronic device, the device having a first coefficient of thermal expansion and a first thermal conductivity, the heat sink comprising a body for removing heat from the heat generating electronic device, the body comprising:

a first region adjacent the heat generating electronic device, the first region having a second coefficient of thermal expansion substantially matching the first coefficient of thermal expansion and the first region having a second thermal conductivity greater than the first thermal conductivity; and a second region remote from the heat generating electronic device, the second region having a third coefficient of thermal expansion greater than the second coefficient of thermal expansion and a third thermal conductivity greater than or equal to the second thermal conductivity; and wherein the material composition of the body varies from the first to the second region along a substantially uniform gradient.

9. The heat sink of claim 8 wherein the coefficient of thermal expansion of the first region of the body is in the range of from about $1.5 \times 10^{-6}.K^{-1}$ less than to about $4.0 \times 10^{-6}.K^{-1}$ greater than the first coefficient of thermal expansion of the heat generating device.

10. The heat sink of claim 8 wherein the first region of the body comprises a material having a coefficient of thermal expansion from about 4.5 to $10.0 \times 10^{-6}.K^{-1}$.

11. The heat sink of claim 8 wherein the first region of the body comprises AlSiC and the second region of the body comprises aluminum.

12. The heat sink of claim 8 wherein the first and second regions of the body are integral.

13. The heat sink of claim 8 wherein the body further comprises a cooling fan.

14. A heat sink for a heat generating device, the heat generating device having a first coefficient of thermal expansion and a first thermal conductivity, said heat sink comprising:

a body for removing heat from the heat generating device, the body comprising first and second regions, the first region of the body having a second coefficient of thermal expansion substantially matching the first coefficient of thermal expansion and the first region having a second thermal conductivity greater than the first thermal conductivity; and the second region of the body having a third coefficient of thermal expansion greater than the second coefficient of thermal expansion and the second region having a third thermal conductivity greater than or equal to the second thermal conductivity, the first region of the body being in thermal contact with the heat generating device; and wherein the material composition of the body varies from the first to the second region along a gradient.

15. The heat sink of claim 14 wherein said gradient is a substantially uniform gradient.

16. A method of reducing the stress induced by heat cycling in a device, said device having a first coefficient of thermal expansion and a first thermal conductivity, the method comprising:

providing a first body adjacent the device, the first body having a second coefficient of thermal expansion substantially matching the first coefficient of thermal expansion and the first body having a second thermal conductivity greater than the first thermal conductivity;

providing a second body adjacent the first body, the second body having a third coefficient of thermal expansion greater than the second coefficient of thermal expansion, and the second body having a third thermal conductivity greater than or equal to the second thermal conductivity;

providing a gradient of material composition between said first and said second body; and uniting the device to the first body and the first body to the second body such that a continuous heat path is formed among the device, the first body and the second body.

17. The method of claim 16 where the device is an electronic circuit.

18. The method of claim 16 wherein said gradient is substantially uniform gradient.

19. A method of reducing the stress induced by heat cycling in a heat generating device, the device having a first coefficient of thermal expansion and a first thermal conductivity, the method comprising:

forming an integral heat sink body having a contact end and a cooling end, said contact end comprising a first material, the first material having a second coefficient of thermal expansion substantially matching the first coefficient of thermal expansion and the contact end having a second thermal conductivity greater than the first thermal conductivity; and the cooling end comprising a second material, the second material having a third coefficient of thermal expansion greater than the second coefficient of thermal expansion and a third thermal conductivity greater than or equal to the second thermal conductivity;

providing a gradient of material composition between said contact end and said cooling end; and bonding the contact end of the body to the heat generating device.

20. The method of claim 19 wherein said gradient is a substantially uniform gradient.

* * * * *